(12) United States Patent
Regev et al.

(10) Patent No.: US 6,600,147 B2
(45) Date of Patent: *Jul. 29, 2003

(54) OPTICAL POWER SOURCE CONTROLLER WITH CONTROL INPUT APPROXIMATION

(76) Inventors: Zvi Regev, 23875 Ventura Blvd., #202A, Calabasas, CA (US) 91302; Alon Regev, 23875 Ventura Blvd., #202A, Calabasas, CA (US) 91302

( * ) Notice: Subject to any disclaimer, the term of this patent is extended or adjusted under 35 U.S.C. 154(b) by 0 days.

This patent is subject to a terminal disclaimer.

(21) Appl. No.: 10/228,143

(22) Filed: Aug. 26, 2002

(65) Prior Publication Data

US 2002/0190196 A1 Dec. 19, 2002

Related U.S. Application Data

(63) Continuation of application No. 09/603,241, filed on Jun. 23, 2000, now Pat. No. 6,441,364.
(60) Provisional application No. 60/141,163, filed on Jun. 25, 1999.

(51) Int. Cl.[7] .................................................. G01N 9/04
(52) U.S. Cl. ....................................... 250/221; 250/214
(53) Field of Search ................................ 250/221, 214; 372/31, 32, 34, 29

(56) References Cited

U.S. PATENT DOCUMENTS

| 5,073,838 A | 12/1991 | Ames |
| 5,118,964 A | 6/1992 | McArdle |
| 5,144,632 A | 9/1992 | Thonn |
| 5,276,404 A | 1/1994 | Yeates |
| 5,396,059 A | 3/1995 | Yeates |
| 5,894,490 A | 4/1999 | Plourde |
| 6,441,364 B1 * | 8/2002 | Regev et al. ............... 250/221 |

* cited by examiner

Primary Examiner—David V. Bruce
Assistant Examiner—Irakli Kiknadze
(74) Attorney, Agent, or Firm—Blakely Sokoloff Taylor & Zafman LLP

(57) ABSTRACT

A controller for an optical power source such as a laser diode which detects environmental conditions and adjusts an input control signal to force the correct output power. The controller learns a specific optical sub-system's output characteristics according to environmental parameters measured by the sub-system's own sensors, and then controls the control input by calculating a very precise approximation from that knowledge. Optionally, the controller could monitor the actual output power, making adjustments to its knowledge as necessary. This would compensate for any time drift in the characteristics of the sub-system. Finally, the controller can detect when the sub-system starts to fail by monitoring how its output power characteristics change with time.

28 Claims, 5 Drawing Sheets

OPTICAL POWER SOURCE CONTROLLER WITH CONTROL INPUT APPROXIMATION

This application is a Continuation of application Ser. No. 09/603,241 filed Jun. 23, 2000, now U.S. Pat. No. 6,441,364, which claims benefit of Ser. No. 60/141,163 filed Jun. 25, 1999.

FIELD OF THE INVENTION

This invention relates to the field of optical emitters, and particularly to a power controller for a laser diode.

Prior Art

In U.S. Pat. No. 5,396,059, Paul D. Yeates of AT&T Bell Laboratories ("Yeates") describes a similar invention to control OPS output. However, this invention claims several important improvements. These improvements stem primarily from a difference of approach. Yeates's approach is to use a simplistic model to guess coarsely at the correct CS to provide the correct output power; then ignore the model, measure and use feedback to obtain exactly the right output regardless of any errors in the model. Although this guarantees absolute accuracy, it is also slow. The present invention uses a complex model and calculates the expected CS through interpolation of discrete measured values. The calculated value is expected to be almost exact since it is calculated from the system's own behavior, using a sophisticated enough interpolation to ensure accuracy. The feedback mechanism, if used, is only used to compensate for slow drift in the laser's behavior. This invention does not guarantee absolute accuracy, but it can be made to perform arbitrarily well. Also, this invention is much faster, since it does not require a feedback loop. Transitions between power levels can be performed much more smoothly without any need to verify and correct the output power.

1. Yeates describes calibrating one prototypical system and storing its parameters in all systems. This invention improves upon this by calibrating each system individually, which provides more accurate parameters for each system.
2. Yeates uses a calibration mechanism with a temperature controller, as this invention does in the exemplary case. However, Yeates stores the Initial Guess CS's $I_{ij}$ as a function of the temperature commanded by the temperature controller; in other words, $T_j$ is the temperature commanded by the temperature controller instead of the temperature measured by the system. This invention improves upon this because it calculates X as a function of the actual environmental parameters measured by the environmental sensors embedded in the system, the same ones which will be used to measure the environment during the operation of the system. This has three benefits:
    a. The environment commanded may be slightly different from the environment affecting the laser, so measuring the environment near the laser will give a better indication of actual environmental influence;
    b. This invention automatically compensates for any systematic error in the environmental sensors, since the same sensors are used for calibration as for operation;
    c. This invention allows calibration to be performed during operation, if necessary.
3. Yeates describes storing CS values for each power and temperature value. We can call this table I where the elements $I_{ij}=I(P_i, T_j)$. When an output power P needs to be commanded and the temperature is T, the system looks up the i and j such that $P_i$ is the closest power to P of any powers in the set, and $T_j$ is the closest temperature to T of any temperatures in the set. It then uses $I_{ij}$ directly. It then measures the output power and adjusts the CS until the power matches the desired power P. Although this ensures accurate power output, it also can be very slow. Instead of setting an initial guess and then using feedback to arrive at the final CS, this invention calculates a theoretical final CS value by some form of interpolation from a large parameter vector X. In this way, it does not need to measure the actual output power and adjust the CS until the power matches. This allows the system to be very fast. Although it is open-loop and the output is not guaranteed to exactly match the desired output, improvements #1 and #2 above help ensure accuracy since each laser-sensor system's characteristics are measured and stored with that system, and X and the interpolation function can be arbitrarily sophisticated in order to meet accuracy needs. If closed-loop accuracy is desired, the system can also implement Enhancement #2, which compensates for drifting.
4. Yeates stores in the system memory parameters indicating the effect of aging on one prototypical OPS; i.e., it introduces laser age as a parameter in its CS model. Because aging effects are highly variable, this invention measures the effect of aging instead, and adjusts the model X accordingly. This ensures that the model is always up-to-date and accurate regardless of the OPS used. It also allows end-of-life detection to be based on the actual performance of the laser, since the extent of aging can be measured by watching for deviations from the normal.

SUMMARY OF THE INVENTION

Optical power sources (such as laser diodes) can be and often are used in applications which require that the optical power output be controlled precisely. (One of the most readily apparent applications is fiber-optic communications, where the laser's power level is interpreted as a signal.) However, optical power emitted is usually a function of an input control signal, temperature and other environmental parameters. In order to control the output power precisely in the face of changing environmental conditions, a Controller could detect the environmental conditions and adjust the input control signal to force the correct output power.

This invention describes a novel way of implementing such a Controller. The Controller would learn a specific optical sub-system's output characteristics according to environmental parameters measured by the sub-system's own sensors, and would in the future control the control input by calculating a very precise approximation from that knowledge. Optionally, the Controller could monitor the actual output power, making adjustments to its knowledge as necessary. This would compensate for any time drift in the characteristics of the sub-system. Finally, the Controller could also detect when the sub-system starts to fail by monitoring how its output power characteristics change with time.

DETAILED DESCRIPTION OF THE INVENTION

This invention describes a novel method for controlling the output power of an optical sub-system in the face of changing environmental conditions.

Basic Structure

Figure 1:
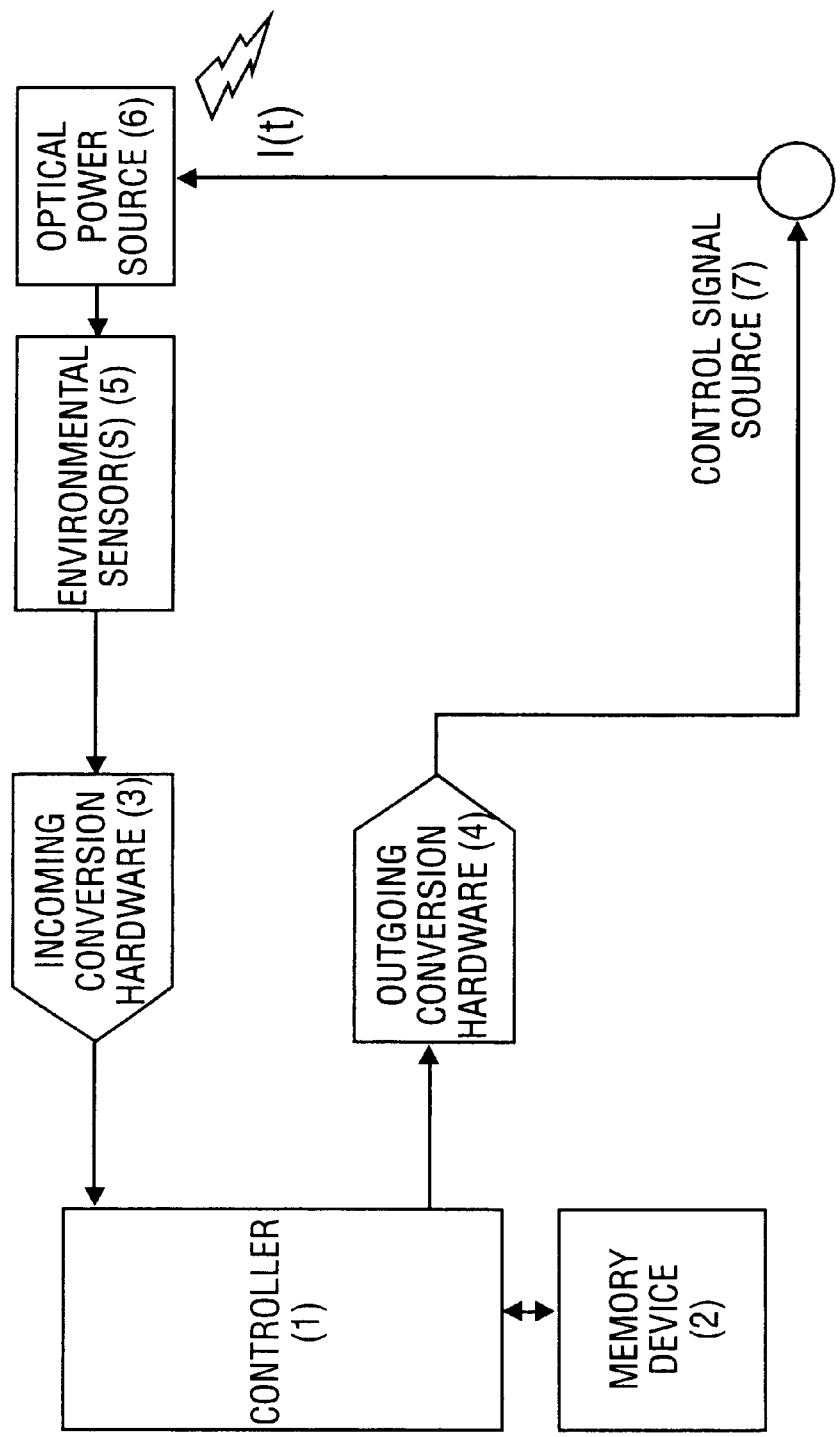
FIG. 1 is a block diagram showing the overall basic structure of the invention.

The basic structure of the system is shown in FIG. 1.

An Optical Power Source (OPS) such as a laser diode (6) Optical output power requirement P is a function of a Control Signal (CS) (7), wherein the control signal is converted to a current driving the laser Diode, and of environmental parameters, and can be written as follows:

P(I, T)

where I is the CS controlling the OPS, and T is a vector representing the state of all environmental parameters $T_1$, $T_2$... $T_n$. In general, P(I, T) varies from OPS to OPS.

According to this invention, initial measurements of P(I, T) are taken at discrete points in the (I, T) space. This process is called Calibration. Typically, these measurements would be taken as part of a system calibration during production. However, this need not be the case. For instance, they could be taken during the initial phase of normal system operation. Hence, we shall refer to these measurements as $P_m$, or the set of $P(I_k, T_1)$, where $I_k$ and $T_1$ are the discrete conditions applied to the OPS. An important distinction as compared to the prior art is that $T_1$ is measured by the system itself, rather than inferred from the value commanded by the environmental controller. This ensures a more accurate calibration which includes any environmental sensor bias. It also allows calibration to be done on-the-fly during operation, if desired.

As part of the calibration process the output properties of the laser diode to be controlled are compared and analyzed by external test equipment for the purpose of relating the internally measured properties with known standard values. The discrete internal measurements are then run through a transformation to modify their values to become OPS Parameters (a vector X), such that when applied to the said laser diode, the output properties will closely match the desired level measured externally. These parameters are intended to allow calculation of an approximation to the necessary CS required to produce a desired output power in the face of specific environmental conditions.

X is then stored in a Non Volatile Memory Device (2) such as an EEPROM. This Memory Device and the OPS would be integrated together in a Controller System. Thus the Memory Device would hold the discrete measurements for a specific OPS which is integrated into the same Controller System.

Then, in normal system operation, a Controller (1), typically a microcontroller use such as an Intel i960 will be asked to command a specific laser Optical power signal $P_c(t)$ to be generated by the Laser Diode. The Controller may get information about some environmental parameters from environmental sensors (5), such as temperature sensors, and Optical output power, possibly through conversion hardware (3) which operates to convert analog quantities into a digital form. The information obtained defined as $T_d(t)$, is a vector consisting of all measurable environmental parameters $T_1(t)$, $T_2(t)$ ... $T_p(t)$, where p≦n. ($T_{p+1}$ ... $T_n$ are treated as random noise sources and dropped from the model.) At any moment t, an estimate of the necessary CS $I_c(t)$ required to command the OPS is calculated from $P_c(t)$, X and $T_d(t)$. $I_c(t)$ will be close enough to the actual CS required to provide adequate performance. The CS is then commanded into the controlling sub-system (7) which generates the current governing the Optical Power Output of the laser diode. Such controlled current sources are well known to those skilled in the art of electronic circuit design, and are typically constructed using an active device such as a BJT or MOS device wherein a voltage applied to the base or gate terminal, respectively, sets and controls the electrical current through the device.

Examples of the Transformation From $P_m$ to X to $I_c(P_c, T_d)$

1. X=$P_m \cdot I_c(P_c, T_d)$ could then be calculated by interpolating between the discrete measurements $P(I_k, T_j)$. Whereas Pm is an external control signal used to modulate the optical power output of the laser diode.

2. X is the coefficients of a function I(P, T), which would typically be a spline or a polynomial. Thus, given an arbitrary $P_c$ and $T_d$, $I_c$ could easily be calculated.

Figure 2:
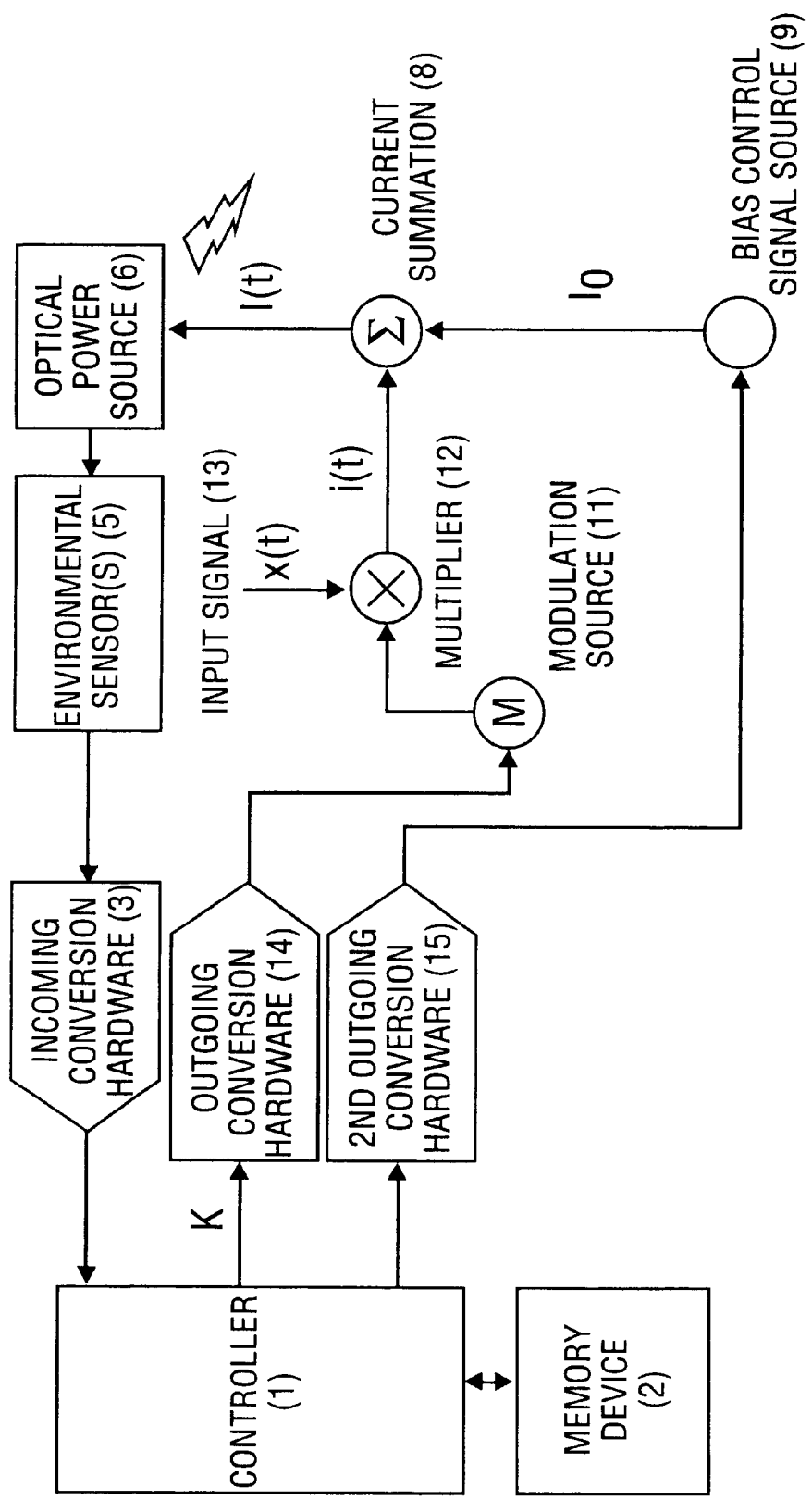
FIG. 2 is a block diagram showing a bias/modulation enhancement of the invention.

FIG. 2 illustrates a Bias/Modulation Enhancement which may be implemented using the invention Typically, laser signals consist of a variation around a nonzero output power. The laser power to represent a given signal x(t) can be expressed as:

$$P(t)=P_b+p(t)$$

$P_b$ is called Bias and is generally a constant. p(t) usually varies quickly with time and carries the information in the signal; it is called Modulation. The magnitude of the variation of p(t) over time is typically much smaller than $P_b$. Also typically, the changing value of $P_b$ within a reasonable range does not change the interpretation of the signal at the receiving end.

The usual method of representing the signal x(t) using this laser power is:

$$p(t)=k_p x(t)$$

where $k_p$ is a constant. The power characteristics P(I, T) of the OPS are generally rather smooth; thus, at a given environmental point $T_0$, there will be "good" powers to operate around, such that, for small ranges of I around a fixed CS $I_0$:

ti $P(I, T_0) \approx P_0 + k_I(I-I_0)$ where $k_I$ is a constant. In other words, the power will vary locally linear with the CS. Thus, in order to produce the proper CS for a signal x(t), the required CS I would be:

$$I=I_0+p(t)/k_I=I_0+K\ x(t)$$

where K=$k_P/k_I$, wherein $k_p$ can be viewed as the bias constant, and ki as the modulation constant In this way, by studying P(I, $T_0$) (or equivalently, X), the controller can select an appropriate bias CS $I_0$ (producing a power $P_0$) such that the variation of power with CS will be approximately linear. It can then calculate the appropriate $k_I$ at that bias CS, and, knowing $k_P$, can calculate K. K and $I_0$ can then be commanded in the system, equipped with a multiplying device, such that the CS I(t) will be approximately equal to $I_0$+K x(t), and the output power P(t) will be approximately equal to $P_0 + k_P$ x(t). It will then command $I_0$ into the bias CS source (9), possibly through conversion hardware (15), and K into the modulation source (11), possibly through conversion hardware (14). The multiplier (12) then multiplies K with the signal x(t) (13) to form the modulation CS i(t). In this implementation the control signal source (7) is emulated in the combination of the bias current source (9), the modulation current source (11), and the multiplier (12) (Note that the inputs to the multiplier may not directly be K and x(t), but representations of them in physical terms such as voltage or current.). These CS's will then be summed by the CS summation block (8). The total CS I(t) through the OPS will then equal the sum of the bias and modulation CS.

Figure 2A:
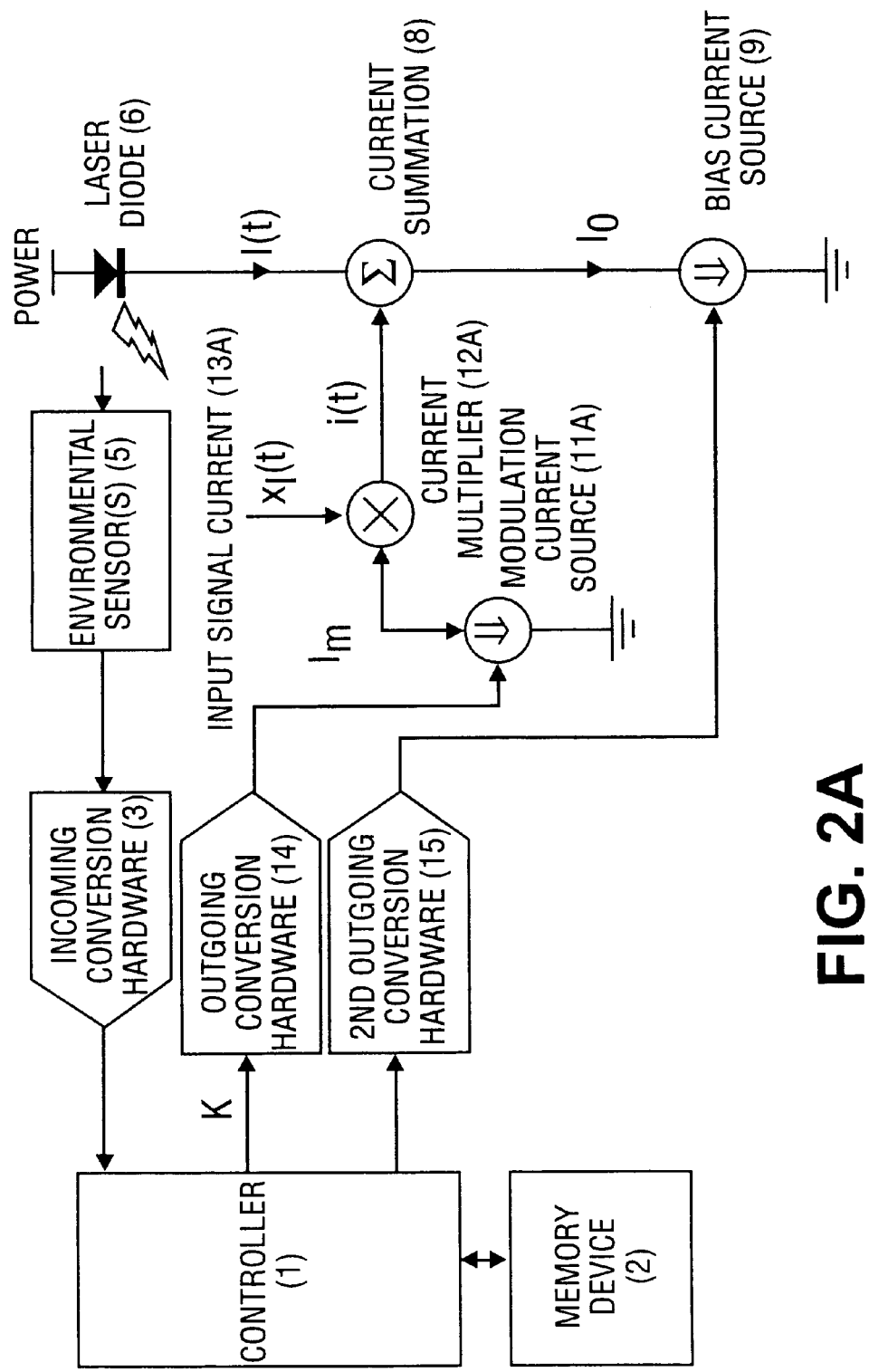
FIG. 2*a* is a block diagram showing an example of the enhancement shown in FIG. 2 using a current source.

An example of such a system is shown in FIG. 2a. The Modulation signal enters as a current $x_f(t)=k_s x(t)$. A current multiplier multiplies it by a modulation current $I_m$ to produce an output current $k_s k_m I_m x(t)$, where $k_m$ is a property of the current multiplier. Thus, $I_m$ would be commanded such that $K=k_s k_m I_m$.

FIG. 2a illustrates an example of enhancement 1 shown in FIG. 2 using Current Source The enhancement shown in FIGS. 2, and 2a wherein the modulating signal is applied in the form of a modulating voltage or current, provides the following four benefits:

1. The bias CS can be coarsely controlled at the same time that the modulation CS is finely controlled. This may result in a cost savings since the system does not require a CS controller which is precise over a large dynamic range.
2. The controller's workload in determining the CS is significantly reduced, since it does not need to monitor a fast-varying signal x(t) and command a fast-varying CS I(t). Instead it monitors environmental parameters, which are varying slowly, to adjust slowly-varying coefficients and biases. This may result in a cost savings since a slow controller may be selected over a faster one.
3. The hardware required to support slowly-varying control signals such as K and $I_0$ is much less costly than that required to support fast-varying control signals such as x(t) and I(t). For example, if the controller is a digital controller, Analog-to-Digital and Digital-to-Analog converters are required to command the system. The cost of such devices is proportional to the required speed.
4. An analog multiplier (12a), such as a device know to those skilled in the art of radio frequency design as a mixer, can be used to provide the final modulation CS. This allows an analog signal to be the command signal without having to convert it to a digital signal. Conversion to a digital signal would result in loss of accuracy, and cannot in general support very high frequency signals such as 1 to 10 GHz. Such frequencies are common in fiber-optic communications.

Figure 3:
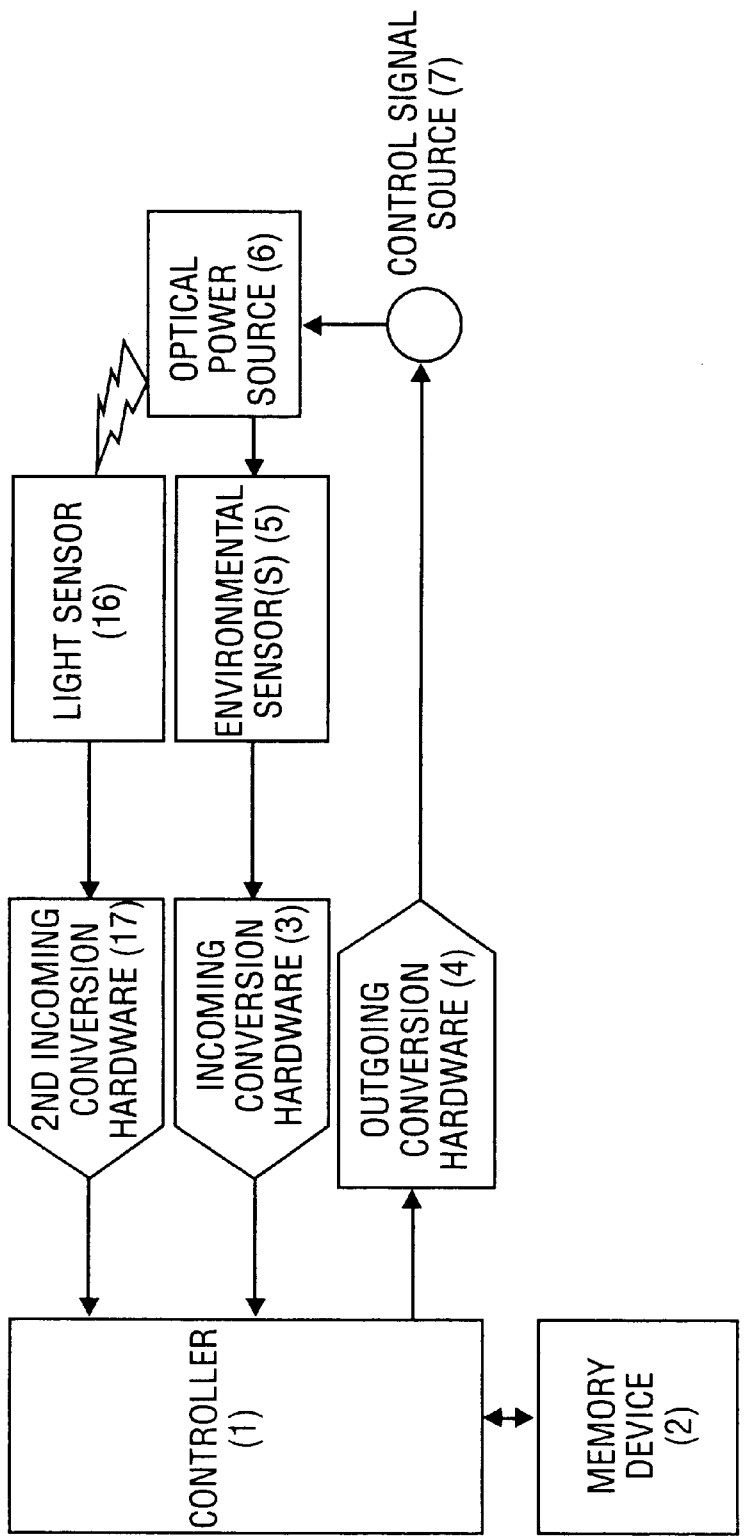
FIG. 3 is a block diagram showing an implementation of the invention where the output power is monitored.

FIG. 3 illustrates an embodiment for Monitoring Output Power

The system may also monitor the output power of the OPS using a light sensor (16), possibly through conversion hardware (17). This allows for the possibility of three enhancements, to the invention:

1. The system may continually adjust X in order to reflect drifts in the OPS properties.
2. The system may observe a drift in X which is characteristic of the OPS's deterioration (such as a very fast drift, or an X which has drifted very far from the original X) and warn the user in advance so that the equipment can be replaced before it fails.
3. The system may perform its own calibration, either with the help of an environmental controller which commands environmental parameters, or as needed during the course of its operation.

Current Technology and Cost Saving Provisions

Figure 4:
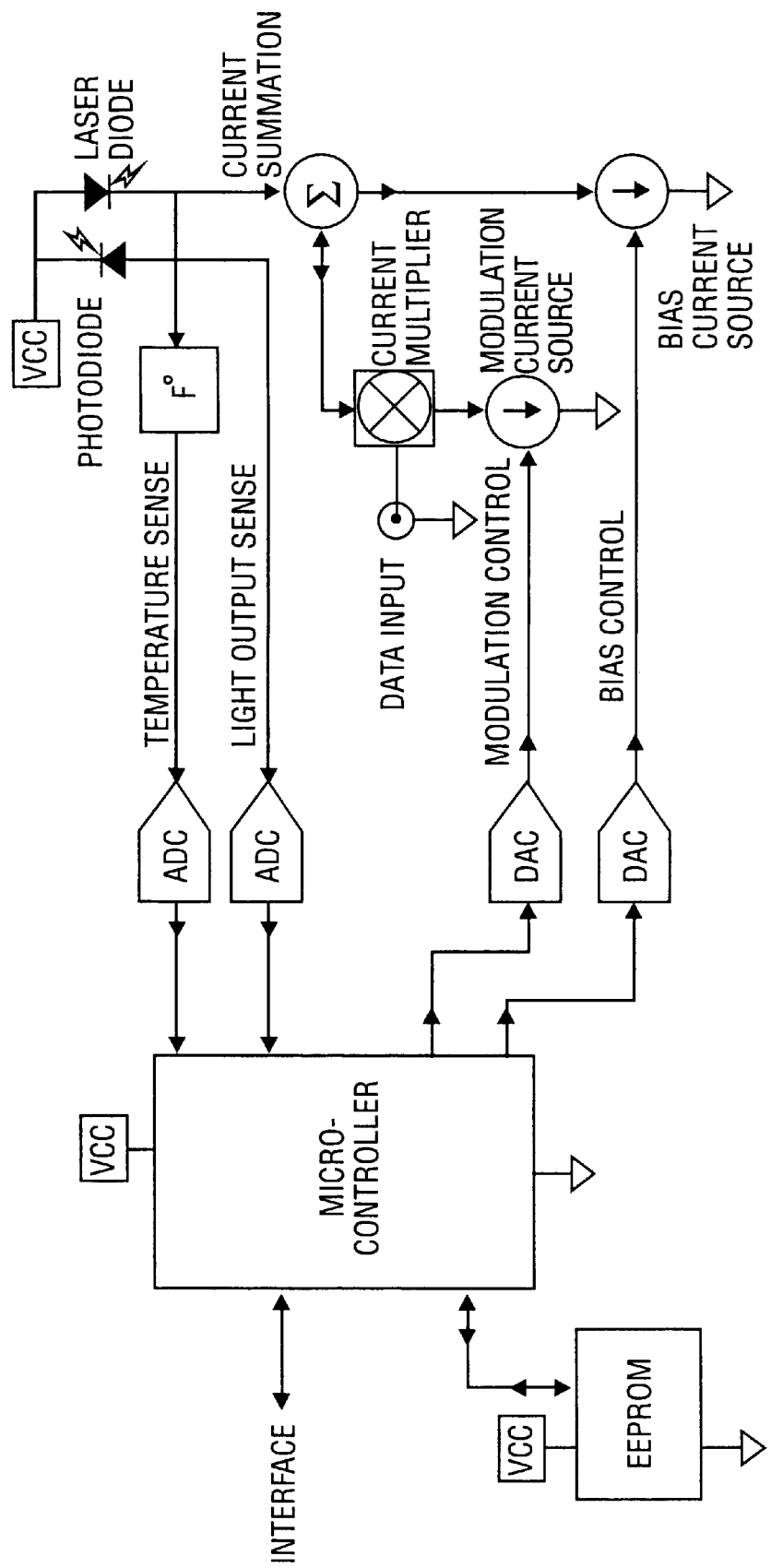
FIG. 4 is a detailed diagram showing a particular implementation of the invention.

This invention can easily be implemented using current technology in a very efficient and cost-effective manner. FIG. 4 illustrates a fully implemented system with very standard, inexpensive components. This invention may be embodied as shown in FIG. 4 as an efficient and simple implementation of the system.

In most systems, only the temperature of the laser diode will be measured, so that $T_d(t)$ consists only of the temperature. This is because the temperature is typically the most significant environmental factor in a laser diode's behavior. An added advantage is that a laser diode's temperature can usually be measured easily by observing the voltage across the laser diode. This tends to greatly simplify the necessary circuitry, resulting in a cost savings.

A photodiode can easily be used to monitor the actual output power of the laser.

A digital controller such as a simple microcontroller or DSP can be used cheaply and effectively to control the diode. In addition, changes to the system can be made in software, resulting in inexpensive maintenance and upgrades. The conversion hardware then becomes Analog-to-Digital Converters (ADCs) and Digital-to-Analog Converters (DACs).

An EEPROM can be used as the Non Volatile Memory Device which stores X, since it is inexpensive, highly reliable, and can easily be written and rewritten.

What is claimed is:

1. An optical sub-system for producing an output signal in response to an input signal, wherein a plurality of operating parameters of the optical sub-system may change in value as a function of variations in the optical sub-system environment, the changes resulting in unwanted variations in the output signal, comprising:
a memory programmed to include a set of parameters, calculated using devices external to the sub-system, that allow a processor to calculate, from sensed operating parameters, an approximation to a control input signal that is needed to produce a desired output signal.

2. An optical sub-system as defined in claim 1 wherein the memory is further programmed to allow the processor to adjust the stored set of parameters using a measurement of the output signal, affecting the future calculation of the output signal and thereby compensating for aging effects.

3. An optical sub-system as defined in claim 2 wherein the measured signal is used to determine if the optical sub-system is nearing the end of its life.

4. An optical sub-system as defined in claim 3 wherein a part of the input signal is one of analog and high-bandwidth and is not monitored by the controller.

5. An optical sub-system as defined in claim 3 wherein the sensed operating parameters include temperature.

6. An optical sub-system as defined in claim 2 further comprising said processor, wherein the processor is an embedded digital processor accompanied by A/D and D/A converters.

7. An optical sub-system as defined in claim 2 wherein the output signal is measured by a photodiode.

8. An optical sub-system as defined in claim 2 wherein the sensed operating parameters include temperature.

9. An optical sub-system as defined in claim 2 wherein the measurement of the output signal is used to indicate optical power reflection in one of the sub-system and an optical fiber driven by the sub-system.

10. An optical sub-system as defined in claim 1 wherein a part of the input signal is one of analog and high-bandwidth and is not monitored by the sub-system.

11. An optical sub-system as defined in claim 10 further compressing said processor wherein the processor is an embedded digital processor accompanied by A/D and D/A converters.

12. An optical sub-system as defined in claim 1 further comprising said processor, wherein the processor is an embedded digital processor accompanied by A/D and D/A converters.

13. An optical sub-system as defined in claim 1 wherein the memory is a Non Volatile Electrically Programmable Memory.

14. An optical sub-system as defined in claim 1 wherein the output signal is produced by a laser diode.

15. An optical sub-system as defined in claim 1 wherein the sensed operating parameters include temperature.

16. An optical sub-system as defined in claim 15 wherein the temperature is obtained by a measured voltage across a laser diode that produces the output signal.

17. An optical sub-system as in claim 15 wherein the temperature is obtained using one of a voltage across a diode and a temperature dependent resistor.

18. An optical sub-system as in claim 1 wherein the memory is programmed after it is assembled into the subsystem.

19. An optical sub-system as in claim 1 wherein the memory is further programmed to allow the processor to control the average optical output power and the ratio between maximum and minimum output power produced by the subsystem.

20. An optical sub-system as in claim 1 further comprising said processor, wherein the processor can be instructed by an external signal to one of turn ON and turn OFF optical power in the output signal.

21. A method for controlling an optical power source, comprising:
   (a) measuring output characteristics of an optical power source whose output power is a function of an input control signal and is affected by an environmental factor, the output characteristics being measured at a plurality of different instances of the input control signal and the environmental factor;
   (b) based on the measured output characteristics in (a), determining a mathematical relationship between (1) a variable that represents the input control signal and (2) a plurality of variables that represent the output power and the environmental factor; and
   (c) using the mathematical relationship determined in (b) to calculate a value of the input control signal that would yield a desired output power, based on the desired output power and a present value of the environmental factor, during normal operation of the optical power source.

22. The method of claim 21 wherein the environmental factor is a temperature of the optical power source.

23. The method of claim 21 wherein the mathematical relationship is determined by interpolating a plurality of discrete points of the variable that represents the input control signal and the plurality of variables that represent the output power and the environmental factor.

24. The method of claim 21 wherein the input control signal is a laser diode current.

25. The method of claim 21 further comprising:
   repeating (a)–(c) a plurality of times to update the mathematical relationship a plurality of times and update the input control signal a plurality of times, during normal operation of the optical power source, to maintain accuracy in controlling the power source.

26. The method of claim 25 further comprising:
   detecting a drift in the mathematical relationship as (a)–(c) are repeated during normal operation, and in response warning a user of the optical power source.

27. The method of claim 25 wherein during normal operation, the optical power source is used for fiber optic communications and the output power level is interpreted as a communications signal.

28. The method of claim 21 wherein a magnitude of a time drift in the mathematical relationship with respect to previous mathematical relationships determined for similar values of the environmental factor are indicative of a condition of a laser diode in the optical power source, and may predict an arrival of end of life of said laser diode.

* * * * *